(12) United States Patent
Rossini et al.

(10) Patent No.: US 8,945,977 B2
(45) Date of Patent: Feb. 3, 2015

(54) INTERCONNECTION METHOD FOR A MICRO-IMAGING DEVICE

(71) Applicant: Commissariat a l'Energie Atomique et aux Ene Alt, Paris (FR)

(72) Inventors: Umberto Rossini, Coublevie (FR); Thierry Flahaut, Cholonge (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/048,383

(22) Filed: Oct. 8, 2013

(65) Prior Publication Data

US 2014/0099744 A1 Apr. 10, 2014

(30) Foreign Application Priority Data

Oct. 10, 2012 (FR) .................................... 12 59678

(51) Int. Cl.
*H01L 21/768* (2006.01)
*G02F 1/1333* (2006.01)
*G02F 1/1362* (2006.01)
*G02F 1/136* (2006.01)

(52) U.S. Cl.
CPC ........ *G02F 1/1333* (2013.01); *G02F 1/136213* (2013.01); *G02F 1/136227* (2013.01); *G02F 2001/13613* (2013.01); *G02F 2001/136281* (2013.01)
USPC ................. 438/97; 257/72; 257/225; 438/57; 438/98

(58) Field of Classification Search
USPC .......... 257/72, 225, 431; 438/48, 97, 98, 455, 438/459
See application file for complete search history.

(56) References Cited

U.S. PATENT DOCUMENTS

| | | | |
|---|---|---|---|
| 5,499,124 A * | 3/1996 | Vu et al. .......................... | 349/45 |
| 5,757,445 A | 5/1998 | Vu et al. | |
| 6,346,978 B1 | 2/2002 | Hsu et al. | |
| 6,486,929 B1 | 11/2002 | Vu et al. | |
| 2006/0209248 A1 | 9/2006 | Shimada | |
| 2010/0045919 A1 | 2/2010 | Chida et al. | |
| 2010/0273319 A1 | 10/2010 | Mikami et al. | |
| 2012/0086683 A1 | 4/2012 | Segura Puchades | |

FOREIGN PATENT DOCUMENTS

| | | |
|---|---|---|
| EP | 1 580 813 A2 | 9/2005 |
| EP | 2 439 583 A1 | 4/2012 |

OTHER PUBLICATIONS

French Preliminary Search Report issued Jun. 19, 2013, in French Application No. 12 59678 filed Oct. 10, 2012 (with Written Opinion and English Translation of Categories of Cited Documents).

* cited by examiner

*Primary Examiner* — Daniel Shook
(74) *Attorney, Agent, or Firm* — Oblon, Spivak, McClelland, Maier & Neustadt, L.L.P.

(57) ABSTRACT

A method for producing an opto-microelectronic micro-imaging device includes a step of forming a first functional part on the base of a first substrate, a base layer, and first electric connection pad. The first functional part is transferred onto a second substrate. The first substrate is thinned until the base layer is reached. A second functional part is formed on the base layer. One via is connected to the first electric connection pad and through the first functional part. The step of forming the second functional part includes connecting the via with the second electric connection pad.

18 Claims, 3 Drawing Sheets

INTERCONNECTION METHOD FOR A MICRO-IMAGING DEVICE

TECHNICAL FIELD OF THE INVENTION

The present invention generally relates to the production of small sized opto-microelectronic devices of the imaging device type and more particularly micro-imaging devices wherein the dimension is smaller than 1" (i.e. 2.54 cm). Among others, imaging devices using a transmission technique are concerned, wherein luminous rays are generated by a source located on the side opposite the images exit face (or screen).

Such imaging devices are more particularly semiconductor on insulator types and require to transfer the functional layers provided on the surface of a substrate onto another support. These are hybrid devices which combine electronics and optics.

STATE OF THE ART

The micro-electronics industry uses more and more sophisticated techniques to be able to produce hybrid electronic devices, more particularly the integrated systems of the optoelectronics type used by all kinds of portable devices such as telephones, computers and other devices having to combine electronics and optics. Such techniques more particularly require being able to transfer functional layers provided on the surface of a first substrate onto a second substrate.

From the origin, one conventional optical component of such devices is a large-sized screen or a display system, the dimensions of which are given in inches (1"=2.54 centimeters), or even in dozens of inches, often of the so-called <<liquid crystal>> type. Generally called by the acronym LC, for <<liquid crystal>>, such large-sized display systems combine optics and electronics typically as, in each pixel, a selection transistor.

More recently, the need to use small-sized imaging devices, having a screen diagonal of less than one inch arose. This typically relates to display systems and projectors too, which are called micro display systems or micro, or nano, projectors. For example, a nano projector may then be integrated in a portable device to be able to project images onto a relatively large-sized screen. Producing such imaging devices implies, however, implementing manufacturing techniques compatible with the size of the pixels which must be obtained then, i.e. a few microns (one micron or micrometer=$10^{-6}$ meter) only.

To be able to produce selection transistors having a sufficient performance in each pixel, and also to integrate all the required peripheral circuits, a layer of single-crystal silicon must be available so that the so-called <<metal oxide semiconductor field effect transistor>> also called MOSFET transistors technology can be used. For this purpose, these must be produced on a first substrate while potentially using all the techniques having been developed and implemented for decades by the microelectronics industry for the production of conventional electronic integrated circuits.

As schematized in FIG. 1, during a first conventional step 1, the pixels selection MOSFET transistors and all the electronics required are first produced on the surface of a first wafer or substrate 10 made of a semiconducting material, most often silicon. The functional part 12 exists as a global layer which comprises a plurality of sub-layers among which a layer made of single-crystal silicon used as a base for the creation of the MOSFET transistors and layers superimposed on the previous ones. To be able to transfer the part 12 onto a second substrate, as will be seen hereinafter, the method of production must however make sure that a separation means, such as a layer 15, under the layer 12, exists or has been created beforehand. Such layer 15 is used, for example, as a base layer for a chemical etching or as a less resistant layer which will enable a mechanical separation.

The upper face 14 of the first functional part 12 which contains all the already manufactured circuits is then glued, during the next step n° 2 onto a second support or substrate 20. In the case of a display device or a projector, the second substrate is a wafer made of a transparent material, typically glass.

The functional part 12 based on the first substrate and containing the already manufactured components is then actually transferred, during the next step n° 3, onto the second substrate after the excess thickness 16 of the first substrate has been removed, as shown by the arrow 18. Various methods are known and used by the microelectronics industry, such as creating a fracture zone enabling a cleavage and a new utilisation of the remaining thickness of the first substrate. Mechanical and chemical attacks of the first substrate may thus be combined until a base layer created in the first substrate beforehand is reached. Depending on the case, the whole or a part of the separation layer 15 remains above the layer 12.

Whatever the method used for the transfer, upon completion of this step, a first functional part 12 will be available, wherein active components of the MOSFET type will have been produced from single-crystal silicon and above which another functional part 30 of the hybrid component must be produced. In the case of a display device or of a projector, during the next step 4, the pixels shall have to be made of liquid crystals.

In practice, the transfer technique briefly disclosed above always goes together with a horizontal geometrical deformation, at the wafer 40 level, of the thin layer transferred from the first substrate. Such deformation, also called a flat deformation, causes the transferred patterns 42 to be moved, more particularly along a plane transversal to the thickness of the wafer 40 relative to the initial nominal position 44 thereof, i.e. the one obtained after the photolithography operations executed on the first substrate prior to the transfer. The result is thus uncertainty as to the position of the patterns of the first substrate. According to the present state of the art, the result is an oversizing, in the first functional part 12, of the pads used for the subsequent connection with electric connection elements formed on the second functional part 30. The possible shifting between the positions of the components of the first functional part 12 prior to and after the transfer must be taken into account, which leads, in practice, to reducing the integration density of the first substrate in order to accommodate such shifting.

It should be noted here that the transfer of a single-crystal silicon layer onto a second substrate is currently used by the microelectronics industry to obtain elaborate substrates of the so-called SOI, for <<silicon on insulator>> type, i.e. <<silicon on insulator>> substrates. However, in this case, as no pattern has been created prior to the transfer of a thin continuous layer, made of an insulator and single-crystal silicon, the flat deformations have no consequences. The presence of patterns as electric connections in the transferred layer reveals the flat deformation.

One object of the invention thus consists in disclosing a method making it possible to accommodate the flat deformations appearing upon transferring a layer of components already formed on the surface of a first substrate onto a second substrate without affecting the integration density and even advantageously increasing it significantly.

Other objects, characteristics and advantages of the present invention will be obvious upon examining the following description and the appended drawings. Of course, other advantages may be integrated therein.

SUMMARY OF THE INVENTION

One aspect of the embodiments of the invention relates to a method for producing an opto-microelectronic micro-imaging device comprising:

a step of forming a first functional part on the base of a first substrate of the semiconductor on insulator type which comprises a surface layer made of a single-crystal semiconductor and a base layer made of an electrically insulating material laid immediately under the surface layer, with the surface layer and at least a part of the base layer being part of the first functional layer, a step of forming wherein at least one metal oxide semiconductor field effect transistor (MOSFET) is provided from the surface layer and at least one wiring layer, above the surface layer, wherein at least a first electric connection pad is formed and is so configured as to participate in an electric connection of one transistor electrode with one pixel electrode, a step of transferring the first functional part by making an upper face of the first functional part located on one side of the first functional part opposite the base layer integral with a second substrate, a step of thinning the first substrate on the face of the first substrate opposite the second substrate until the base layer is reached while preserving at least a part of the thickness of the base layer, a step of forming, on the base layer, a second functional part comprising the pixel electrode and provided with at least a second electric connection pad so configured as to participate in the electric connection of the transistor electrode with the pixel electrode.

This method is advantageously characterized in that:

it comprises, prior to the step of transferring the first functional part, a step of forming at least one via connected to the first electric connection pad and going through the first functional part from the first electric connection pad to the base layer included;

the step of forming the second functional part comprises the connection of the via with the second electric connection pad.

Preferably, the width of the second electric connection pad is selected so as to be at least equal to twice a maximum flat deformation supported by the first functional part during the transfer operation.

The application of the method of the invention makes it possible not to affect the integration density of the first functional layer by not having it accommodate the so-called flat geometrical deformations supported by such layer upon the transfer onto the second substrate.

As a matter of fact, according to the existing techniques, whereas the electric connection pads of the first electric layer must be so dimensioned as to accept the geometrical variations, the invention transmits the taking into account of the geometrical deformations from the first functional layer to the second functional layer. Prejudice is thus fought since the specialists would systematically try to solve the problem of the flat deformation where it occurs, i.e. on the first functional layer, formed from the first substrate.

According to other aspects, the invention also relates to a device provided with a first functional layer and a second functional layer and obtained thanks to the method of the invention.

BRIEF DESCRIPTION OF THE FIGURES

The aims, the objects, as wall as the characteristics and the advantages of the invention will be best understood when reading the detailed description of one embodiment of the latter, as illustrated by the following appended drawings, wherein.

Figure 1A:
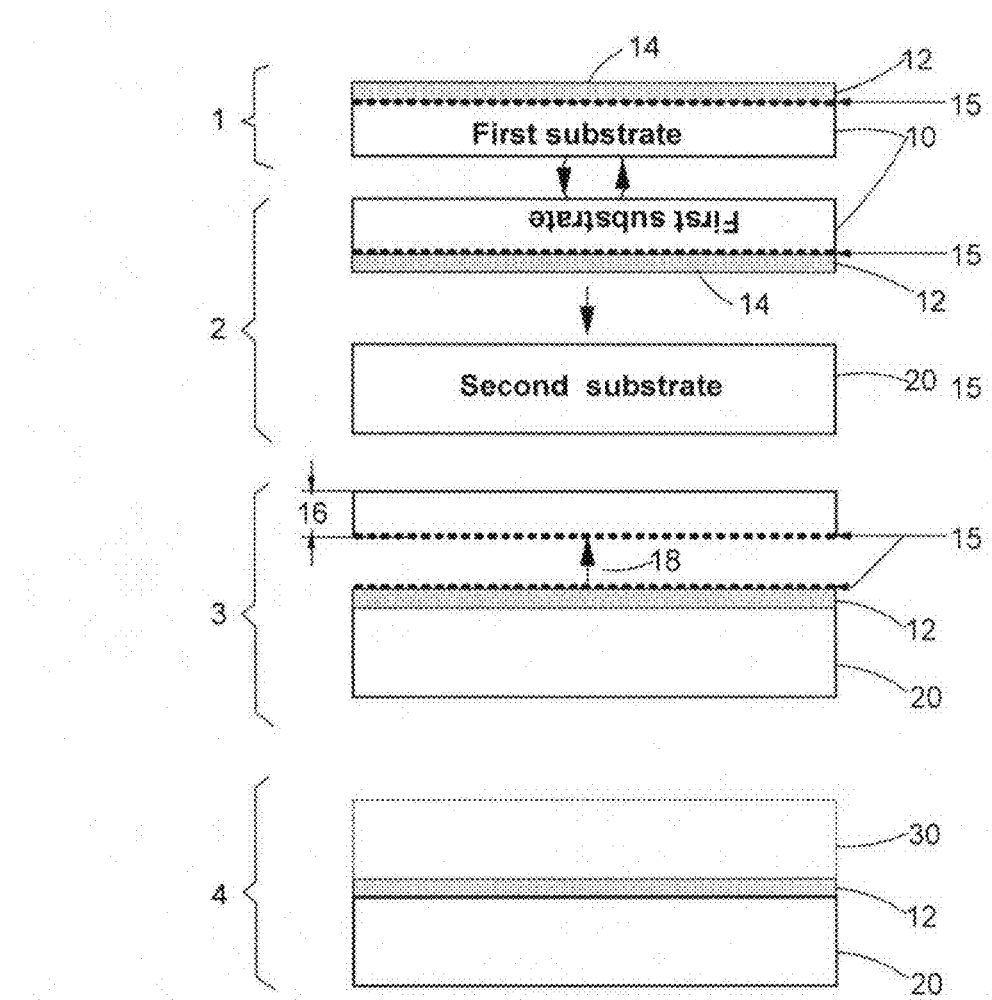
FIG. 1a discloses the steps of transferring a functional layer from a first substrate onto a second substrate and FIG. 1b illustrates a so-called flat geometrical deformation of the transferred layer.

The appended drawings are examples of and are not a restriction to the invention.

DETAILED DESCRIPTION OF THE INVENTION

Before giving a detailed description of the invention while referring to the Figures, the optional characteristics that the invention may integrid are listed hereinunder, either separately, or as a combination thereof:

the width of the second pad connected to the via is selected to be substantially equal to twice a maximum flat deformation (D) supported by the first functional part during the transfer operation.

the step of forming the via comprises forming a via hole by photolithography for defining a via hole pattern and etching.

the formation of the via hole is so configured as to obtain a via hole having a diameter of less than 1 micrometer, preferably smaller than 0.8 micrometer, even 0.5 micrometer.

the width of the first electric connection pad is smaller than the width of the second electric connection pad.

the width of the first electric connection pad is smaller than 0.5 micrometer, and preferably smaller than 0.4 micrometer.

the step of forming the first functional part is so configured that the distance between the transistor and the first connection pad transversally to the thickness of the first functional layer is as small as possible, for example smaller than 0.5 micrometer, with the distance having to be sufficient, on the other hand, to preserve the integrity of the transistor. Reference will be made for estimating such minimum distance to the drawing rules imparted on the technology used for this purpose.

the first electric connection pad is made of metal.

the second electric connection pad is made of metal.

the pixel electrode is semi-transparent or transparent.

the first functional part comprises a plurality of metal oxide semiconductor field effect transistors (MOSFET) and several first electric connection pads, and the second functional part comprises several pixel electrodes and several second electric connection pads, and several vias are formed so as to electrically connect a first electric connection pad and a second electric connection pad.

the surface layer is made of single-crystal silicon and the base layer comprises a buried silicon oxide layer (BOX).

the step of forming the first functional layer comprises forming isolation casings delimited by trenches filled with silicon oxide.

the part of the grid of the at least one transistor is made of polycrystalline silicon in a layer of the first functional part located immediately on the surface layer.

the step of forming the first functional layer comprises providing a plurality of wiring layers at various levels, in the first functional layer.

means are formed for optically processing the luminous flux in the second functional part.

the second substrate is selected so as to be transparent.

the step of forming the second functional layer comprises forming a liquid crystal layer in contact with one face of the pixel electrode opposite the second electric connection pad.

Besides, a few general remarks can be found hereinunder:

the method disclosed here concerns small-sized imaging devices, also called micro-imaging devices, which means, in the present description, any image generation device (projectors and display devices in particular) the dimensions of which are such that the diagonal of the image production window has a length of 1" (i.e. 2.54 cm) at most. If the device is highly miniaturized, the term <<micro-imaging device>> includes nano-imaging devices.

functional part means a part, more particularly as a stack of layers, of the device able to fulfil at least one technical function determined by the application. For example, a functional layer may be used as electronic control means, especially with switching functionalities for example implemented by the selection transistors. A functional part may also have an optical function, integrating liquid crystals and optionally too at least a portion of the means for the control thereof, thus ensuring a light valve functionality. Any part provided with electric conduction means generally is included in the scope of the functional part designation. The latter may also comprise different sub-layers.

the terms electric connection pad mean any means able to fulfil an electric connection function, for example for the electrical transmission of information (transistor control or liquid crystal control via an electrode, for example). Preferably, the electric connection pads may be made of metal, and more particularly of copper.

the step of thinning mentioned in the summary of the invention includes any step of continuous or non continuous reduction in the thickness of a substrate, by mechano-chemical, mechanical, chemical polishing or using any other means.

the expression <<base layer>> means a portion of the thickness of the first substrate of the silicon on insulator (SOI) type used to receive the stack of the layers and the constituents of the first functional part. The base layer may optionally participate in the process of thinning the first substrate by being used as a stop layer for a selective mechano-chemical polishing, as a detection layer for identifying a transition between two layers controlling the stopping of the thinning or still as a fracture layer for thinning including a breaking of the first substrate.

the term <<thickness>> is used for defining a dimension along the direction of the stacking of the layers of the produced device. The term <<width>> is used for describing a dimension oriented transversally to the thickness.

the terms like <<under, above, superimposed, underlying" or equivalent, are used to describe a relative position of two parts of the device along the dimension in thickness of the latter. They do not systematically imply that the parts concerned are in contact with one another and, for example immediately above or under one another.

the expressions like <<equal to, smaller than, greater than>> mean comparisons of sizes. Such comparisons may accept some tolerances, more particularly according to the size scale of the values compared and the measures uncertainties. Substantially equal, smaller or greater values are included in the scope of interpretation of the invention.

Prior to further describing the content of such Figures, it should be noted that, although the description of the invention hereinunder is based on a separation means taking advantage of the presence of a base layer 15 to chemical etching, and as mentioned in the section relating to the state of the art, all the other methods used by the micro-electronics industry are liable to be used for separating the first substrate and the first functional part when implementing the invention.

In the following exemplary implementation of the invention, the first substrate 10 is an elaborate substrate of the SOI type. This type of substrate has become a basic component of the micro-electronic industry and is commercially available, more particularly with specialized manufacturer like the SOI-TEC company, the head office of which is in Bernin, France. Generally speaking, it is a silicon substrate 10 already comprising a thin uniform surface layer of single-crystal silicon 120 separated from the substrate proper by a layer of insulator made of or comprising for example silicon oxide ($SiO_2$). Most often designated by the acronym BOX for <<buried oxide layer>>, this layer will be used as a base layer 15 for chemical etching as mentioned above and in the section relating to the state of the art.

It should be noted here that the utilization of a SOI substrate of the silicon/$SiO_2$/silicon type for the first substrate is just an exemplary implementation of the invention. The surface layer 120 used for producing the electronic components may be more generally made of another single-crystal semi-conducting material. It may be, for example, germanium (Ge) or a so-called III/V alloy like gallium arsenic (AsGa). Any semi-conducting layer which may be used to produce high performance transistors is generally liable to be fit. Similarly, the base layer 15 is not necessarily made of SiO2, nor the substrate proper if silicon. To transfer the part 120 and the components formed therein, as explained hereinunder, to constitute the global functional part 12, it is sufficient, in this exemplary implementation of the transfer, for the first substrate 10 to be able to be selectively etched relative to the base layer 15. The substrate 10 and the base layer 15 must then preferably be made of appropriate materials only having a significant etching difference for a given etching means. During a first phase, a large part of the substrate 10 is generally eliminated by mechanical (by rectification for example) and/or mechano-chemical means and the elimination of such substrate 10 is completed by selective etching, while stopping the etching on the base layer. In the illustrated case of a silicon substrate and of a base layer made of $SiO_2$, the chemical solution used for selectively etching the silicon of the first substrate is for example TMAH (Tetramethylammonium hydroxide). The significant etching difference between the two materials makes it possible to stop the etching precisely on the buried oxide layer (BOX) while preserving all the components already formed. The essential of the base layer 15 then remains in place and then belongs to the transferred functional part 12. As an alternative solution, the base layer may also be removed, by selective etching relative to the surface layer 120 (for example using hydrofluoric acid (HF) etching in the case of a SiO2 base layer and of a silicon surface layer.

Figure 2A:
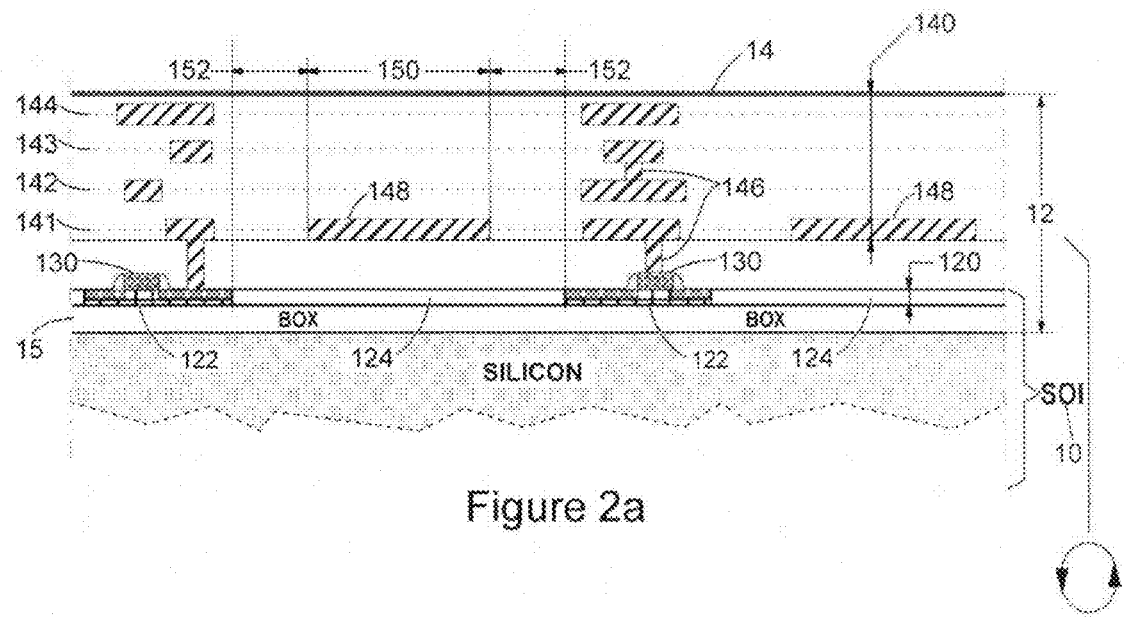
FIGS. 2a and 2b conventionally illustrate how to take into account the flat deformation caused by the transfer at the first substrate.
Figure 2B:
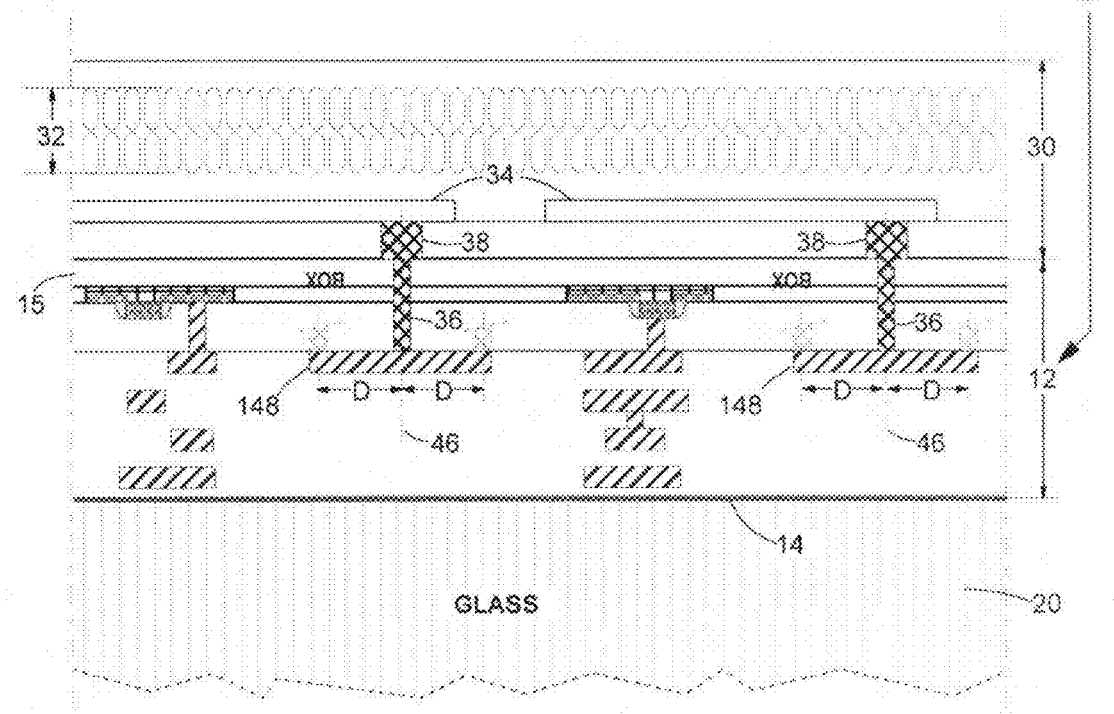

FIGS. 2a and 2b illustrate the conventional way to take account of the flat deformation caused by the transfer of a functional part from a first substrate onto a second substrate.

FIG. 2a illustrates the structure of the first substrate after the active components have been produced from the single-crystal layer 120 so as to constitute the functional part 12 which will be transferred onto a second substrate.

Conventionally, the active components are produced from a 501 type substrate in the lands or boxes 122 created in the thin single-crystal silicon layer 120 positioned above the buried oxide layer (BOX) of the original SOI substrate. Typical values of thickness for such layers are respectively 0.15 and 0.4 micron. The boxes 122 are isolated from one another by the trenches 124 filled with oxide. Obtaining such boxes is known to the specialists and results for example from the application of a so-called STI method for <<shallow trench isolation>>. The trenches are in fact dug in the thin single-crystal silicon layer 120 until the oxide of the buried layer (BOX) is reached for delimiting the boxes. Once the trenches are filled with oxide, the boxes are then fully electrically isolated from one another.

Figure 3A:
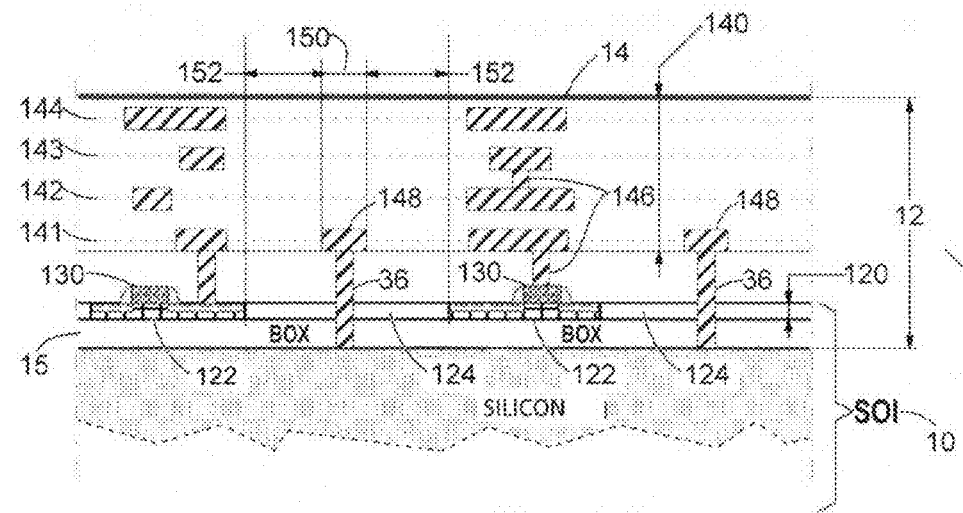
FIGS. 3a and 3b show how the flat deformation is taken into account according to the invention without affecting the integration density of the first functional part from the first substrate.

The active components and more particularly all the transistors required for laying the electronic circuits of the system can then be provided in the boxes. In the case of imaging devices of the type of those considered in the invention, the selection transistors of the pixels can more particularly be provided therein. Such transistors will be extremely performing since they are made of single-crystal silicon and advantageously based on an insulating layer limiting current leakages. The invention makes no assumption however on the structure, nor on the type of the transistors produced. They generally are so-called MOSFET transistors, for <<metal-oxide-semiconductor field-effect-transistor>>. The grid 130 of such transistors is generally made of polycrystalline silicon, and is schematized here in FIG. 3a in one layer of the functional part 12 immediately above the surface layer 120. Source and drain, the two other electrodes of the transistor are positioned in the layer 120 and obtained by doping of the underlying silicon from the layer 120. They are also shown in FIG. 3a with a pattern darker than the grid 130 and on either side of a channel part of a transistor.

Once produced, all the transistors must be interconnected to provide the electronic functions integrated in the system. Four layers of horizontal wiring: 141, 142, 143 and 144 are buried in oxide 140 which is used as an insulator and are represented here as an example. The number of layers required depends on the density of the interconnections between the components of the system and in general on the complexity of the functions to be provided. Vertical connections must also be provided between the layers, more particularly as vias 146 which are also used to reach the electrodes of the transistors. The means and methods for obtaining such results are known to the specialists. For example, the wiring of the recent integrated circuits is provided by the interconnections and the copper vias using a so-called <<double damascene>> technique which makes it possible to obtain the wiring structure shown in FIG. 2a. The surface 14 of such wiring layers will be glued on the second substrate during the following operation. As regards the wiring, the specificity of a hybrid system as considered by the embodiment of the invention described here is that the interconnections with the parts of the system which will be produced after transferring the part 12 onto a second substrate must also be provided for, upon completion of the first wiring level 141. As a matter of fact, the first wiring level 141 will be the most accessible one after the turning over and the gluing on the second substrate.

Figure 1B:
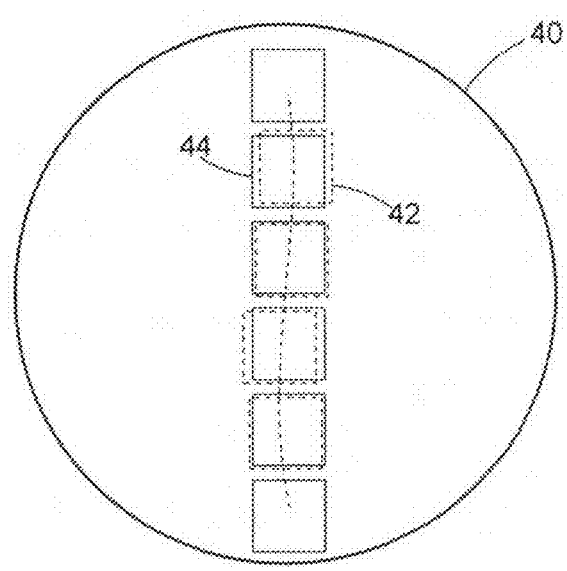

To compensate for the flat deformation discussed in the section relating to the state of the art and illustrated in FIG. 1b, pads 148 having a size 150 compatible with the maximum shift which may result from the transfer, must then be provided for in the transferred layers from the first substrate, for each interconnection which must exist between the components created prior to, and after the transfer. Such shift is illustrated in FIG. 1b as a pattern 42 shifted relative to the nominal position 44 thereof.

It should be noted here that the interconnections between the components produced prior to and after the transfer may be very numerous. In the case of an imaging device, each pixel must be connected to at least one selection transistor. It must be possible to form hundreds of thousands of interconnections, even millions thereof for the densest matrices, which significantly affects the density of the electronic circuits which may be produced on the first substrate. As a matter of fact, the size 150 of the surface of the pads 148 does not depend on the geometrical specifications which apply to define the patterns of the first substrate but on the maximum shift resulting from the flat deformation which may be accepted. It should also be noted that no active component can be present under the metallic pad 148 and that the geometrical constraints specific to the first substrate must be complied with, too, as they indicate the minimum distance 152 which must exist with the boxes wherein the active components, i.e. the MOSFET transistors are provided.

For example, the residual shift which must be accommodated amounts to +/−0.5 micron, while taking into account the corrections made by the equipment ensuring the insulation of the resists used during the lithography operations, such equipment being known as a <<stepper>>. This requires the creation of a metallic pad 148 for connection with the components of the second substrate having a size 150 of 1 micron, whereas the minimum size which should be provided to meet the geometrical specifications alone of the first substrate, and in the absence of flat deformation, would be less than 0.1 micron under the same conditions.

FIG. 2b illustrates the device after the transfer onto the second substrate 20, under the conditions described above, and after the production of the components produced afterwards. Such components constitute the functional part 30 produced after the transfer. They comprise, in the case shown, a plurality of second electric connection pads 38, with each one being made in contact with the corresponding via 36. Opposite the via 36, the electric connection pad 38 is connected to an electrode 34, for example made of ITO.

Gluing (which means here any assembling method) of the upper surface 14 of the first functional part 12 (i.e. the external face of the part 12 opposite the substrate 10 used as a support at this stage) on the second substrate 20, made of glass in this example, may use techniques and methods known to the specialists. It may be, for example, direct gluing (with no addition of adhesive material) or gluing using adhesive material. Gluing and the transfer of the thin functional layer 12 previously created on a first substrate are the causes of the flat deformation noted.

The invention makes no assumption as to the nature of the components created in the part 30 but the layer 30 will typically comprise a liquid crystal layer 32 above the electrodes 34 made of ITO, for <<indium tin oxide>> i.e. <<indium and tin oxide>>. This material is both transparent and conducting. The electrodes 34 will then define the surface of each one of the pixels of the imaging device.

To provide for the interconnections between the components produced prior to and after the transfer, respectively in the parts 12 and 30, and after the transfer and the removal of the silicon of the first substrate until the base layer 15 is reached, the vias 36 and the electric connection pads 38 which will be used for the connections with the active elements of the layer 30, i.e. the electrodes 34 made of ITO in this example will have to be produced. The vias 36 created after the transfer must be able to reach the connection pads 148 which have been prepared in the functional part 12, produced prior to the transfer onto the surface of the first substrate, and this in spite of the flat deformation resulting from this operation. Such large-sized pads 148 must be able to accommodate the +/−D shifts around a nominal position 46, which significantly affects the integration density of the components produced prior to the transfer onto the first substrate in making it impossible to take full advantage of the geometrical specifications which apply to define the patterns of the first substrate because the resulting maximum D shifting of the flat deformation has to be accommodated as from this level.

Figure 3B:
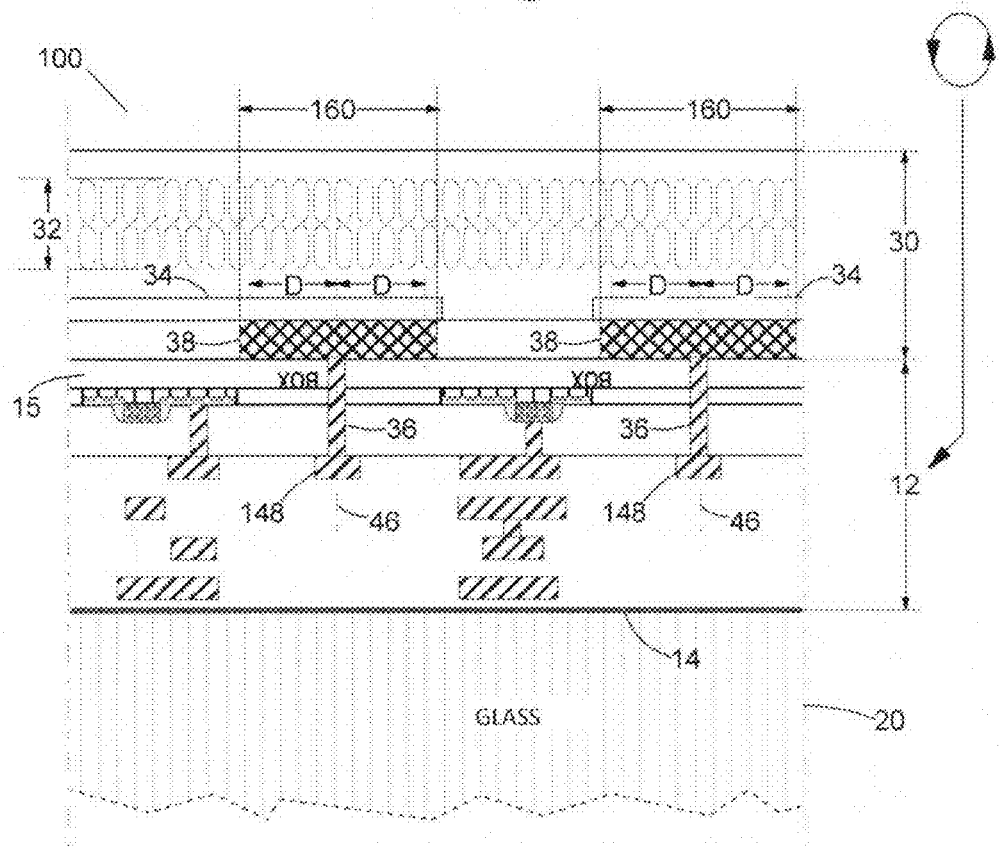

FIGS. 3a and 3b describe an embodiment of the invention and show the characteristic aspects of the invention relative to the typical method shown in FIGS. 2a and 2b. For the common aspects between the case shown in FIGS. 3a, 3b and that in FIGS. 2a, 2b, the points discussed above can be applied to the embodiment shown in FIGS. 3a, 3b. FIG. 3a illustrates, like the preceding FIG. 2a which it must be compared to, the structure of the first substrate prior to the transfer. FIG. 3a specially shows that the vias 36, which enable the interconnection with the components produced after the transfer, are prepared and produced simultaneously with the global layer 12 and preferably using the same techniques and means as those implemented for the production thereof.

The vias 36 are thus preferably etched (which advantageously comprises: a definition of vias patterns using the photolithography technique and the etching proper; in the case of plasma etching, a hard mask may also be used) and at least partially filled with metal, such as copper, like the other vias 146 used on the one hand for interconnecting the different wiring layers and on the other hand for connecting the electrodes of the transistors and active elements produced in the boxes 122. It should be noted that the vias 36 are advantageously so positioned as to go through the oxide layers only, more particularly the STI oxide zones 124 and then the base layer 15 made of the buried oxide layer (BOX) of the original SOI substrate 10. Silicon oxide can easily be etched to form the vias 36 interconnecting the components which are produced after the transfer.

It should be understood that the electrode of a selection transistor (particularly source or drain) may thus be electrically connected to a pixel electrode by a chain of conducting elements comprising a via in contact with the source or the drain as shown, more particularly for the left transistor in FIG. 3b, a contact pad and a circuit at a wiring level (not shown) connected to the first pad 148 followed by the via 36, the opposite end of which is in contact with the second pad 38 applied against the electrode 34.

The vias 36 are characteristically produced during the same production cycle as the functional part 12. The pads 148 for connection with the first metal level 141 may then be produced while taking account the geometrical specifications imparted by the technology used for this layer only. Such specifications define the minimum dimensions of the patterns and the distances which must be provided between the patterns such as for example the distance bearing reference 152. The size 150 representing the width of the connection pads 148 thus no longer depends, like before, on a flat deformation and may be reduced to the minimum size authorized by the geometrical specifications, as can be seen in FIG. 3a. In the case of FIGS. 3a and 3b, the vias 36 go through the base layer 15 and a part of the thickness of the first functional layer 12, specifically the layer 120 at an oxide zone 124. This case is not restrictive. As a matter of fact, the invention applies to any configuration wherein an electric connection pad must be electrically connected to another pad positioned on another functional layer formed from a second substrate. For example, the via 36 may go through a more or less significant part of the thickness of the first functional part.

FIG. 3b illustrates, like the preceding FIG. 2b which it must be compared to, the structure of the first substrate after the transfer and shows how a hybrid device of the micro-imaging device 100 type is provided thanks to the invention.

FIG. 3b more particularly shows that the pads 38, provided in the layer 30 after the transfer, are now used for accommodating a flat deformation. The step of connecting the vias 36 and the pads 38 is advantageously interesting for producing the pads, since the contact thereof is formed when the pads 38 are created. The density of the electric interconnections required in this layer 30 having a technology very different from that 12 used to produce the electronic components enables, without any inconvenient, the production of the pads 38 having a sufficient size 160 to accommodate, at this level, the +/−D shifting already discussed in the preceding Figures.

Within the scope of the production of hybrid opto-electronic devices like the micro-display devices or projectors discussed here, the size of the pixels and of the electrodes 34, made of an electrically conducting and at least semi transparent or even transparent material, and especially ITO, mainly rules the integration density at this level.

The connection pads 38 according to the invention are advantageously made of metal, and for example made of copper, and are preferably produced like the other pads among which the pads 148, so as to equalize the global production method. The utilization of opaque materials may be favoured in one embodiment wherein the pads 38 may also be used as a protection screen against light for the underlying transistors. As a matter of fact, transistors are sensitive to light. Screens should also advantageously be provided for avoiding operational fluctuations with lighting. Other materials may also be selected for the connection pads 38 and for example the transparent or semi-transparent materials (defined here as transmitting at least a part, and preferably at least 50%, of the rays of an incident luminous flux), so that the dimensions in width of the pads 38 are not penalizing as regards optics. In one embodiment, each pad 38 is a portion of the electrode 34.

Flat deformation of the transferred layer can be accommodated thanks to the invention without reducing the integration density thereof.

Forming the vias 36 by photolithography and etching further provides the possibility of a very small dimension of the via holes, especially with a diameter of less than 0.5 micrometer, even less than that and more particularly less than 0.4 micrometer. The first connection pads 148 may have dimensions of the same order, simply in the continuity of the vias 36. They will then advantageously have a much smaller width than that of the second pads 38. Although not shown in the case of the Figures between FIG. 2a and FIG. 3a, it should be understood that such reductions in the dimensions also make it possible to reduce the distance 152 between the pad 148 and the side edge of the transistor, so as to limit such spacing specifically to a distance of less than 1 micrometer, advantageously less than 0.5 micrometer, or even to the minimum imparted by the melter to ensure the transistor integrity. The opening of the pixel is thus advantageously as large as possible. At least one of the transversal dimensions among that of the via 36, that of the pad 148 and the distance 152 is generally so selected as to be the lower limit of the technological capacities of the production methods implemented and especially the photolithography and the other techniques for etching semiconductors.

The invention claimed is:

1. A method for producing an opto-microelectronic micro-imaging device comprising:
   forming a first functional part on the base of a first substrate of a semiconductor on insulator type which comprises a surface layer made of a single-crystal semiconductor and a base layer made of an electrically insulating material laid immediately under the surface layer, with the surface layer and at least a part of the base layer being part of the first functional part, wherein at least one metal oxide semiconductor field effect transistor (MOSFET) is provided from the surface layer and at least one wiring layer, above the surface layer, wherein at least a first electric connection pad is formed and is so configured as to participate in an electric connection of one transistor electrode with one pixel electrode,
   transferring the first functional part by making an upper face of the first functional part located on one side of the first functional part opposite the base layer integral with a second substrate,
   thinning the first substrate on the face of the first substrate opposite the second substrate until the base layer is reached while preserving at least a part of the thickness of the base layer,
   forming, on the base layer, a second functional part comprising the pixel electrode and provided with at least a second electric connection pad so configured as to participate in the electric connection of the transistor electrode with the pixel electrode,
   wherein:
   the method further comprises, prior to the transferring the first functional part, forming at least one via connected to the first electric connection pad and going through the first functional part from the first electric connection pad to the base layer included, and
   the forming the second functional part comprises the connection of the via with the second electric connection pad, with the width of the second electric connection pad being selected so as to be at least equal to twice a maximum flat deformation supported by the first functional part during the transfer operation.

2. The method of claim 1, wherein the width of the second pad connected to the via is selected so as to be substantially equal to twice a maximum flat deformation supported by the first functional part during the transfer operation.

3. The method of claim 1, wherein the forming the via comprises forming a via hole by photolithography for defining a via hole pattern and etching.

4. The method of claim 3, wherein the formation of the via hole is so configured as to obtain a via hole having a diameter of less than 1 micrometer.

5. The method of claim 1, wherein the width of the first electric connection pad is smaller than the width of the second electric connection pad.

6. The method of claim 5, wherein the width of the first electric connection pad is smaller than 0.5 micrometer.

7. The method of claim 1, wherein the forming the first functional part is so configured that the distance between the transistor and the first connection pad transversally to the thickness of the first functional layer is smaller than 0.5 micrometer.

8. The method of claim 1, wherein the first electric connection pad is made of metal.

9. The method of claim 1, wherein the second electric connection pad is made of metal.

10. The method of claim 1, wherein the pixel electrode is semi-transparent or transparent.

11. The method of claim 1, wherein the first functional part comprises a plurality of metal oxide semiconductor field effect transistors (MOSFET) and several first electric connection pads, and wherein the second functional part comprises several pixel electrodes and several second electric connection pads, and wherein several vias are formed, each one being so configured as to electrically connect a first electric connection pad and a second electric connection pad.

12. The method of claim 1, wherein the surface layer is made of single-crystal silicon and the base layer comprises a buried silicon oxide layer (BOX).

13. The method of claim 12, wherein the forming the first functional part comprises forming isolation casings delimited by trenches filled with silicon oxide.

14. The method of claim 12, wherein the part of the grid of the at least one transistor is made of polycrystalline silicon in a layer of the first functional part located immediately on the surface layer.

15. The method of claim 1, wherein the forming the first functional part comprises providing a plurality of wiring layers at various levels, in the first functional layer.

16. The method of claim 1, wherein means are formed for optically processing the luminous flux in the second functional part.

17. The method of claim 16, wherein the second substrate is selected so as to be transparent.

18. The method of claim 1, wherein the forming the second functional layer comprises forming a liquid crystal layer in contact with one face of the pixel electrode opposite the second electric connection pad.

* * * * *